United States Patent [19]

Hüllwegen

[11] 4,404,681
[45] Sep. 13, 1983

[54] DEVICE FOR SETTING A SIGNAL PROCESSING CIRCUIT

[75] Inventor: Josef Hüllwegen, Altenbeken, Fed. Rep. of Germany

[73] Assignee: Nixdorf Computer AG, Fed. Rep. of Germany

[21] Appl. No.: 205,038

[22] Filed: Nov. 7, 1980

[30] Foreign Application Priority Data

Nov. 9, 1979 [DE] Fed. Rep. of Germany ....... 2945331

[51] Int. Cl.³ .............................................. H04B 3/06
[52] U.S. Cl. ..................................... 375/102; 375/11; 340/825.01
[58] Field of Search ........................ 375/12, 14, 11, 38, 375/100, 102; 324/77 C, 77 CS; 455/146, 161, 167, 8, 59, 132, 133, 135, 136, 140, 162; 340/825.01, 825.03; 371/67, 68; 333/1, 2, 18

[56] References Cited

U.S. PATENT DOCUMENTS

| | | | |
|---|---|---|---|
| 3,822,405 | 7/1974 | Sakamoto | 455/167 |
| 3,846,707 | 11/1974 | Sakamoto et al. | 455/167 |
| 3,988,681 | 10/1976 | Schurmann | 455/161 |
| 4,238,727 | 12/1980 | Madni | 324/77 CS |

*Primary Examiner*—Benedict V. Safourek
*Assistant Examiner*—Stephen Chin
*Attorney, Agent, or Firm*—Krass, Young & Schivley

[57] ABSTRACT

A signal processing circuit for a signal varying in its properties, e.g., in its degree of distortion, in which the input signal is fed in parallel to two similar processing circuits e.g., equalizers, the characteristic of which can be varied by a control signal, wherein the control signal from the one processing circuit is periodically varied and the output signal is fed to a detector circuit which in optimum signal processing emits a trigger pulse to a holding circuit 52 which stores the corresponding control signal level, which is fed to the second processing circuit.

The detector circuit provided for an optimum equalization is a timing-pulse-controlled integrating circuit with a minimum detector connected at the output side. An application of the circuit for digital data transmission with the related synchronizing timing demodulator and phase control circuits is represented.

3 Claims, 6 Drawing Figures

DEVICE FOR SETTING A SIGNAL PROCESSING CIRCUIT

DESCRIPTION

1. Technical Field

The invention relates to a device for adjusting a signal processing circuit the output signal of which, with an invariable optimum setting, has a certain characteristic detectable by a detector.

Such a device may, for example in adaptive controls, serve to determine the optimum desired value, which depends on very diverse factors, and feed this to the closed loop. A special application case of such a device is on data transmission units on which an equalizer is used in the region of a data receiver which equalizer is to eliminate the delay or retardation distortion arising from the transmission line. Its optimum setting varies depending on the type of the signal transmitted and the type or extent of the particular distortions, arising from the different transmission lines for example.

2. Background Art

The principle is known of making the required settings with the aid of a computer, but computer time up to several seconds is required, and although this leads to optimum results, it is not logical from the expense standpoint in many cases.

It is the object of the invention to create a device of the above-mentioned type which can be used simply, inexpensively and in a versatile manner.

DISCLOSURE OF THE INVENTION

In accordance with the invention a main signal processing circuit and an equivalent auxiliary circuit are combined with a detector acted on by the output signal of the auxiliary signal processing circuit and emitting a detector signal when this output signal exhibits a predetermined characteristic. The setting of the auxiliary signal processing circuit is periodically varied throughout the total regulating range. A scanning and holding unit transmits the momentary setting of the auxiliary signal processing circuit and retains this setting until the next detector signal.

The correct setting of a signal processing circuit is distinguished for example by the fact that its output signal at this setting shows an extreme value. The setting leading to this extreme value is variable as a function of definite factors, so that a continual readjustment is required. Moreover it is possible that the output signal of the signal processing circuit shows throughout its total regulating range a number of extreme values differing in their absolute level, the absolute maximum of which would correspond to the optimum setting. A signal processing circuit in which this problem occurs for example is a car radio, which should always be set on the traffic radio station which gives the best reception. The solution according to the invention, transferred to a car radio, means that a second receiving part is provided and is periodically tuned throughout the whole receiving frequency range. Only those of the received signals with a traffic radio are evaluated. If the vehicle equipped with this radio is in the region of a plurality of traffic radio stations, then the output signal of the additional receiving part will show a number of maxima during one tuning period, the absolute values of which will generally be different. The detector connected at the output side may be designed so that during the first tuning period it generates a detector signal at every maximum, the absolute value of which signal is higher than the preceding maximum. The detector then stores this highest maximum and in the following periods only generates its detector signal for this greatest maximum. By having the setting or the tuning state of the additional or auxiliary receiving part transmitted to the main receiving part at the moment when the detector signal occurs, the car radio is automatically tuned to the strongest incoming traffic radio station. If the vehicle slowly moves out of the region of this station, then the absolute value of the maximum of the output signal from the auxiliary receiving part becomes lower and lower until finally another station comes in more strongly and tuning to this station results.

It is advantageous if the signal processing circuits can be set by a preferably electrical regulating signal, so that the auxiliary signal processing circuit can be triggered by a sweep unit with a periodically varying regulating signal and the main signal processing circuit be acted on by the output signal of the scanning and holding unit.

A preferred application of the device according to the invention lies in the setting of the equalizer on a signal or data transmission unit which is fed with a signal which has become distorted on a transmission channel. When this is the case with the transmitted signal which contains signal components of different frequencies and which in the undistorted state shows periodic zero-axis crossings, then the delay distortions which occur on transmission and affect the individual frequency components differently lead to a signal state in which the zero-axis crossings of the individual signal components are shifted with respect to one another. The quality of the equalizer setting can thus be measured by how precise the zero-axis crossing of its output signal is. In order to determine this quality by quantitative measurement, one embodiment of the invention proposes that the detector show a full-wave rectifier which is connected by way of a gate circuit to an integrator and an extreme value circuit connected at the output side of the latter, whereby the gate circuit connects through during a data window located symmetrically to the zero-axis crossing of the undistorted data signal and the extreme-value circuit emits the detector signal when the output signal of the integrator reaches a minimum during one period of the regulating signal or of the signal of the sweep unit.

The signal received on a data transmission unit is a modulated signal as a rule, the modulation of which contains the transmitted data from which a data timing pulse signal pulse-locked with the data can be derived. Likewise a phase-locked auxiliary timing pulse signal is derived from the signal fed from the auxiliary equalizer. For opening the gate circuit during the data window, a further development of the invention provides that the output of the auxiliary equalizer is connected with a synchronizing unit which derives the auxiliary timing pulse signal situated on a certain phase relationship to the zero-axis crossing of the input signal, from the output signal of the auxiliary equalizer. This auxiliary timing pulse is delayed in the vicinity of the zero-axis crossings of the modulated input signal, in a signal delay circuit following the synchronizing unit. At the output of the signal delay circuit a pulse generator can be connected which, from the delayed auxiliary timing pulse signal, emits a pulse on the gate circuit which pulse is actuated symmetrically to the zero-axis crossing of the input signal and determines the data window.

A further development of the invention provides that the extreme value detector shows a differential amplifier the two inputs of which are each connected with the signal input of the extreme value detector and the one input of which is moreover connected with the parallel circuit formed by a resistance and a condenser. Depending on whether the extreme value detector is to emit a detector signal for each extreme value of its input signal or only for the absolutely highest or lowest extreme value, the time constant of the RC network can be regulated accordingly.

The main and the auxiliary signal processing circuit may show a coarse-adjustment switch which can be switched over manually or automatically as a function of the input signal, which switch selects the one or plurality of coarse ranges within which the setting according to the invention occurs.

The invention moreover relates to a device for phase synchronization between the data received and the local receiving timing pulse of a receiving point in a data transmission unit which is particularly suited to be connected at the output side, since the phase position of the data is changed by the automatic equalization, which however can be operated and loaded independently of this.

In data transmission systems the problem frequently arises that the data coming into the receiving point in any phase are to be processed in the receiving point by means of a local receiver timing pulse, which presupposes a phase synchronization between the two. The simplest arrangement known for this purpose contains two D flip-flops connected in series. The incoming data are taken in by the first flip-flop under the control of a timing pulse recuperated from them which is called the subsequent data timing pulse to differentiate it from the receiver timing pulse, and under the control of the receiver timing pulse it is overwritten in the second flip-flop. This arrangement operates satisfactorily only when the data timing pulse and the receiver pulse do not show too great a phase shift. It is also possible to store a large amount of data intermediately in order then to scan them again in a certain way under the control of the receiver timing pulse. But this possibility is expensive, however, and requires a large storage capacity. Moreover, it is not capable of on-the-line-operation.

In a device known from German patent specification No. 2,553,105 for phase synchronization, the phase difference between the data timing pulse and the receiver pulse is determined with a phase comparator. The phase comparator includes a counter which counts pulses during a period of time corresponding to this phase difference, so that after the expiration of the counting process the counter position is proportional to the phase difference. The counter position of this counter is used for the presetting of another counter, with the aid of which an operating pulse retarded in accordance with the phase difference detected is derived. The determination of the phase difference then takes place only one time at the start of a transmission cycle.

This known data processing at the receiving point, which is asynchronous with the receiver timing pulse proper, is unsatisfactory in may cases. Therefore the problem is to create a device in which the receiver timing pulse is not translated into the phase position of the data received, but rather the data received are converted into the phase position of the receiver timing pulse. This can be achieved, in the device described, by having a delay unit used in place of the second counter, which unit delays the data received according to the phase difference, and that this phase difference is determined continually and the counter position can correspondingly be corrected upward and downward, so that there is a phase synchronization control.

The counter is preferably a bidirectional counter, the counting unit of which is controllable by the output signal of the phase comparators depending on whether the phase of the data received leads or lags behind that of the receiving timing pulse. In this way, by simple means, an at least quasicontinuous phase synchronization can be achieved, and phase fluctuations which arise due to changes in the setting of the main equalizer can be compensated for.

A phase comparator circuit which can be fabricated with little expenditure of circuitry includes, according to the invention, a first scaler which scales the data timing pulse in 1:2 ratio using a count-by-two circuit, a second scaler which counts down in a 1:2 ratio, a D flip-flop the D input of which is connected with the output of the first scaler, a NAND element the one input of which is connected with the output of the second scaler and the other input of which is connected by way of a NOT gate with the input of the second scaler and the output of which is connected with the timing-pulse input of the D flip-flop. When the sign of the phase difference is reversed with this construction of the phase comparator circuit, then the output signal of the D flip-flop also reverses, which is thus suitable for controlling the counting direction of the bidirectional counter.

BRIEF DESCRIPTION OF THE DRAWINGS

The invention is described in detail in the following on the basis of embodiments with reference to the annexed drawings. In these.

BEST MODE FOR CARRYING OUT THE INVENTION

Figure 1:
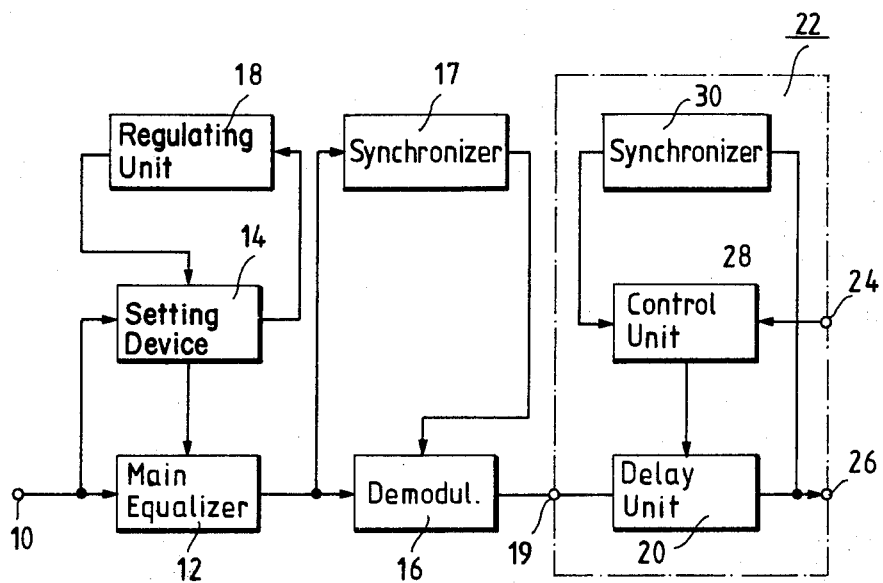
FIG. 1 shows a general block circuit diagram of an equalizer with a setting device according to the invention and a phase synchronizing unit.

FIG. 1 shows part of the receiving point of a data transmission unit.

Figure 2:
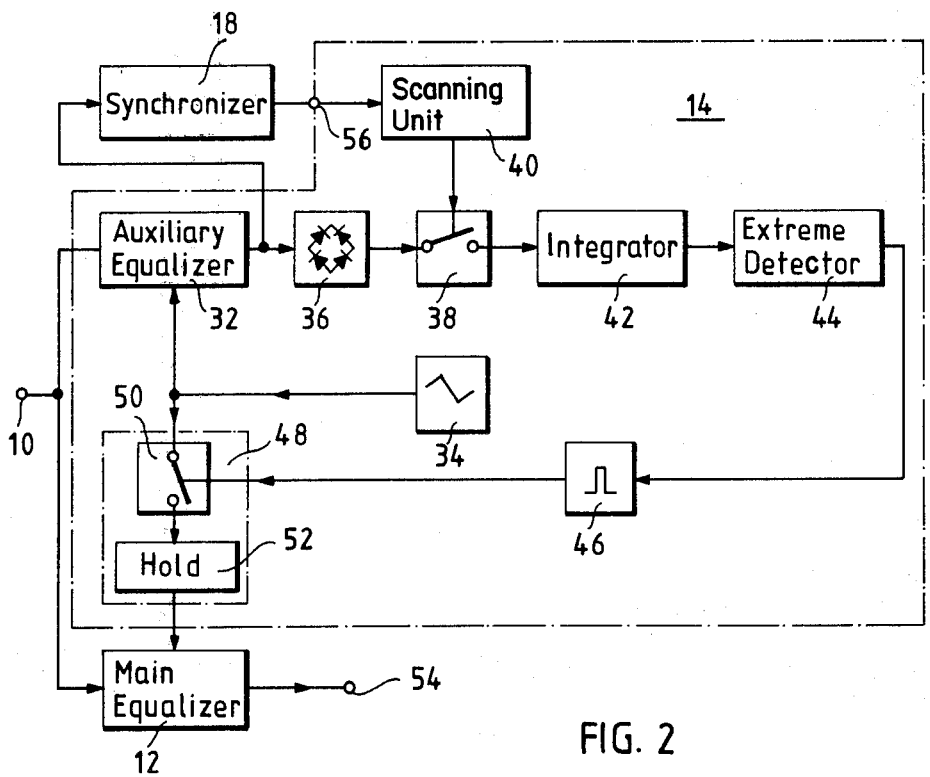
FIG. 2 shows a detailed block circuit diagram of the equalizer with the setting device.

An input signal in the form of a modulate signal distorted in the transmission channel is applied to an input terminal 10. This input signal reaches both a main equalizer 12 and also a setting device 14, which contains an auxiliary equalizer equivalent to the main equalizer 12. The setting device 14 automatically sets the main equalizer 12 in such a way that an optimum equalization of the distorted input signal results. This equalized signal reaches a demodulator 16. At the output of the demodulator appears the data signal which contains the transmitted data and a data timing pulse coupled phase-locked with it. The output signal of the main equalizer is fed to a synchronizing unit 17 to generate the data signal. Another synchronizing unit 18 generates an auxiliary clock signal required for the setting device 14 from the output signal of the auxiliary equalizer 32 (as shown in FIG. 2) in a manner to be described later. The delay unit 20 is part of a phase synchronizing device 22 and causes a shift in the phase of the data signal for matching the timing grid of a local receiver timing pulse, which is fed into the timing terminal 24. The data signal available at the output 26 can be processed further with the aid of the receiver timing pulse. The synchronization between the data of the data signal and the receiver timing pulse is done with the aid of a regulating unit 28 setting the delay time of the delay unit 20, which unit 28 contains a phase comparator. The data timing pulse is recuperated from the output signal of the delay unit 20 by the use of a synchronizing unit 30, the phase of which pulse is compared, the the phase comparator of the regulating unit 28 with that of the receiver pulse on 24. The delay unit is set on the basis of this phase difference.

The setting device 14 will next be described in detail on the basis of FIGS. 2 to 4. FIG. 2 shows a block circuit diagram of this setting device.

As previously mentioned, the setting device 14 contains an auxiliary equalizer 32 which is fully equivalent to the main equalizer 12. Both equalizers can be set by the use of an electrical regulating signal, so that the operation of the equalizer can be varied. For example delay equalizers may be used, the time constants of which are influenced by the regulating signal. When the setting of the main equalizer and of the auxiliary equalizer is the same, their operation is identical. The control input of the auxiliary equalizer 32 is connected with the output of a sweep unit 34, which for example gives a sawtooth regulating signal the amplitude of which is so proportioned that the whole regulating range of the auxiliary equalizer 32 is traversed during one period of the regulating signal. The output signal of the auxiliary equalizer 32 reaches a full-wave rectifier 36 the output of which is connected with the input of a gate circuit 38. The gate circuit 38, as a function of the control signal from a scanning unit 40, creates a connection between the output of the full-wave rectifier 36 and on integrator 42. To the output side of the integrator 42 is connected an extreme-value detector 44, to which in turn a pulse former 46 is connected. The pulse former 46 generates a control signal for another gate circuit 50, which is part of a scanning and holding circuit 48. This scanning and holding circuit moreover contains a memory 52 which when the gate circuit 50 is closed stores the momentary value of the regulating signal from the sweep unit 34 and applies it to the control input of the main equalizer 12. The adjustment of the main equalizer thus depends on the regulating value stored in the memory 52, which in turn is decided by that moment in time, during the period of the regulating signal, in which the pulse former 46 delivers the control signal to the gate circuit 50. When the memory 52 has once received a regulating value, then it holds it long enough until a new regulating value is given upon the reclosing of the gate circuit 50.

The setting of the auxiliary equalizer 32 is continuously varied in the device according to the invention, the whole regulating range being periodically traversed. Accordingly the output signal of the auxiliary equalizer 32 varies, and during this variation the equalization is at times better and at times worse. The detector containing the elements 36 to 46 determines the point in time at which the output signal of the auxiliary equalizer 32 is best equalized. At this point in time the impulse former 46 emits its control signal to the scanning and holding circuit 48, which then takes in the regulating value of the regulating signal applied at this moment and transfers it to the main equalizer 12. If the equalizer setting changes in the course of time, the setting on which the equalization of the incoming signal is optimum, then the main equalizer is also adjusted, since the optimum equalizer is also adjusted, since the optimum equalizer set is verified continuously by the auxiliary equalizer 32. For example another equalizer setting may be required when the distortions in the input signal change, because for example the distortions in the input signal change when this now comes over another transmission channel from another transmitter. But other factors can also affect which equalizer setting is optimum in a given case.

In the present case a special criterion, explained below, is proposed for ascertaining when the setting of the auxiliary equalizer 32 is optimum. It must not be stated that the construction of the detector depends particularly on the particular criterion and is adapted to the criterion used in the present case. If the signal processing circuits described here in relation to equalizers involve, for example, those whose output signal with the optimum setting has an extreme value, then the output of the auxiliary signal processing circuit could be connected directly with the extreme value detector. The elements 36 to 42 would then be superfluous.

Figure 4:
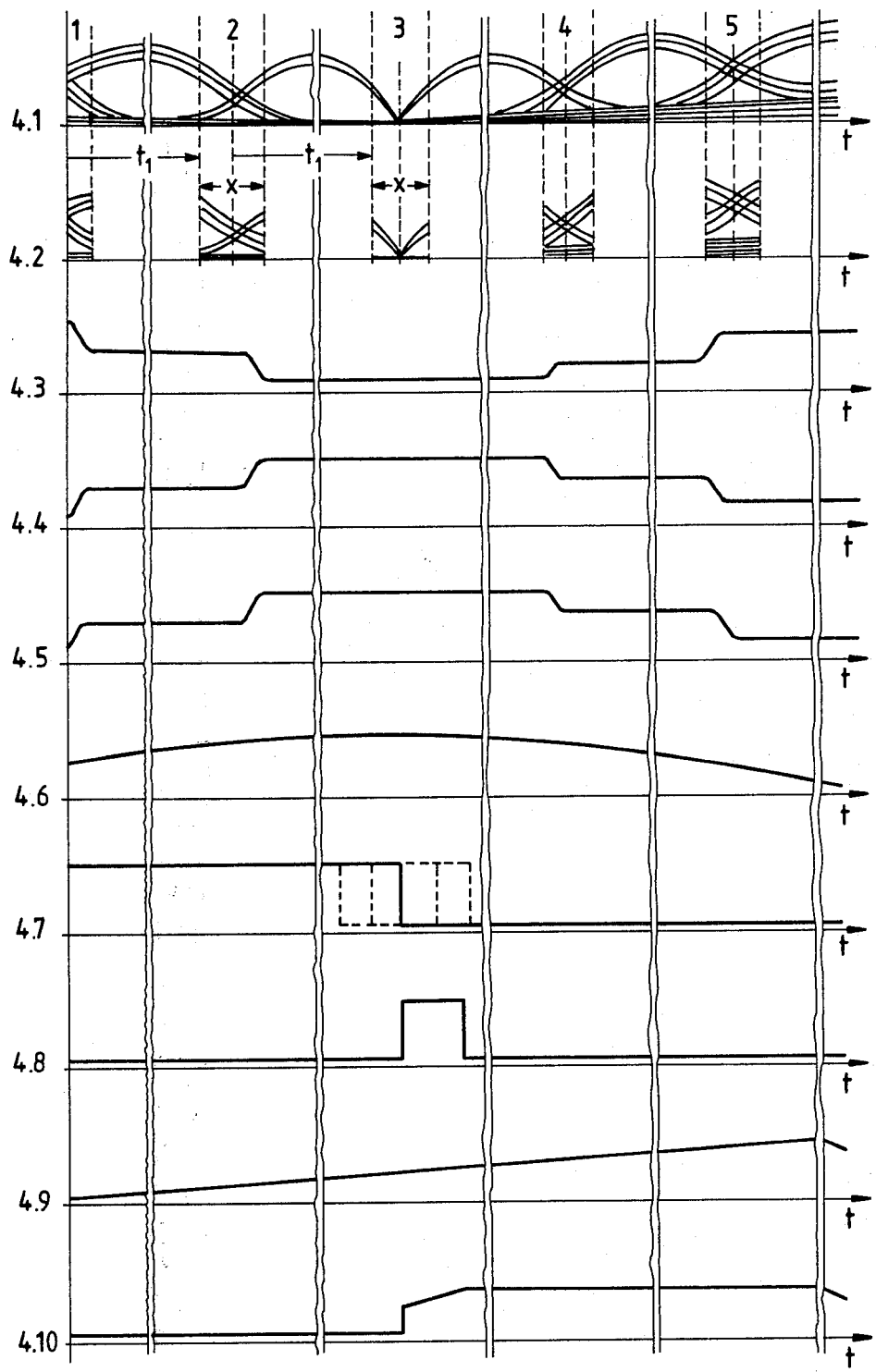
FIG. 4 shows signal curve shapes at different points in FIG. 3.

The criterion used in the present case may be explained on the basis of FIGS. 4.1 and 4.2. The modulated input signal appearing at the input terminal 10 is composed of various signal components and in its undistorted state has a distinct zero-axis crossing, that is, the zero-axis crossings of the individual signal components with different frequencies occur close by in the same phase of the transmission or data timing pulse. It is the task of the equalizer to equalize the attenuation or delay characteristics for different frequencies of the transmission line in such a way that the zero-axis crossings of the signal, which are out of phase with one another in the distorted signal, again fall as close as possible to the same phase of the data timing pulse. FIG. 4.1 shows the desired optimum equalization in setting 3. In settings 1,2,4 and 5 the respective distortion is worse and worse. In FIG. 4.2 one particular time segment each of the signal at the output of the full-wave rectifier 36 is singled out in FIG. 4.2 corresponding to the five setting positions of FIG. 4.1. This involves a time segment or data window x, which is situated symmetrically to the undistorted signal. By comparing the signal segments in FIG. 4.2 it is recognized that the closer the setting of the auxiliary equalizer 32 comes to the optimum setting, the smaller the integral over this signal segment becomes. Therefore by the use of full-wave rectification and integration over a certain data window, the criterion of an exact zero-axis crossing can be converted into the criterion of a minimum. From this it is also seen that the scanning unit 40 must control the gate circuit 38 in such a way that the integrator 42 must be connected with the full-wave rectifier 36 during the period of the input signal and exactly for the duration of the data window x.

The synchronizing unit 18 gains from the equalized signal from the auxiliary equalizer 32, in fairly stable form, the auxiliary timing pulse the phase position of which is a measure of the mean zero-axis crossing of the individual signal components. With the aid of this auxiliary timing pulse the scanning device 40 creates the data window x around the zero-axis crossing. Within the data window a measure of the focusing of the zero-axis crossings is made. Since signal zero-axis crossings with different slopes and directions occur, and their frequency is distributed statistically, no firm limit for the value can be defined. Also, the value depends on the position of the window with respect to the mean zero-axis crossing. Through the full-wave rectification and the subsequent integration of the respective partial surfaces of the signal voltage over the time within the window, a signal is formed for each signal passing through zero, on which the crossing on the center of the window is half as large as that in a position at the edge of the window. Since many such contributions are made during a correspondingly long integration time, a relative measurement of the quality of the equalization is provided. Because the input signal is equalized better to the extent that the auxiliary timing pulse derived from the synchronizing unit 18 is more stable, the equalization touches the optimum.

Figure 3:
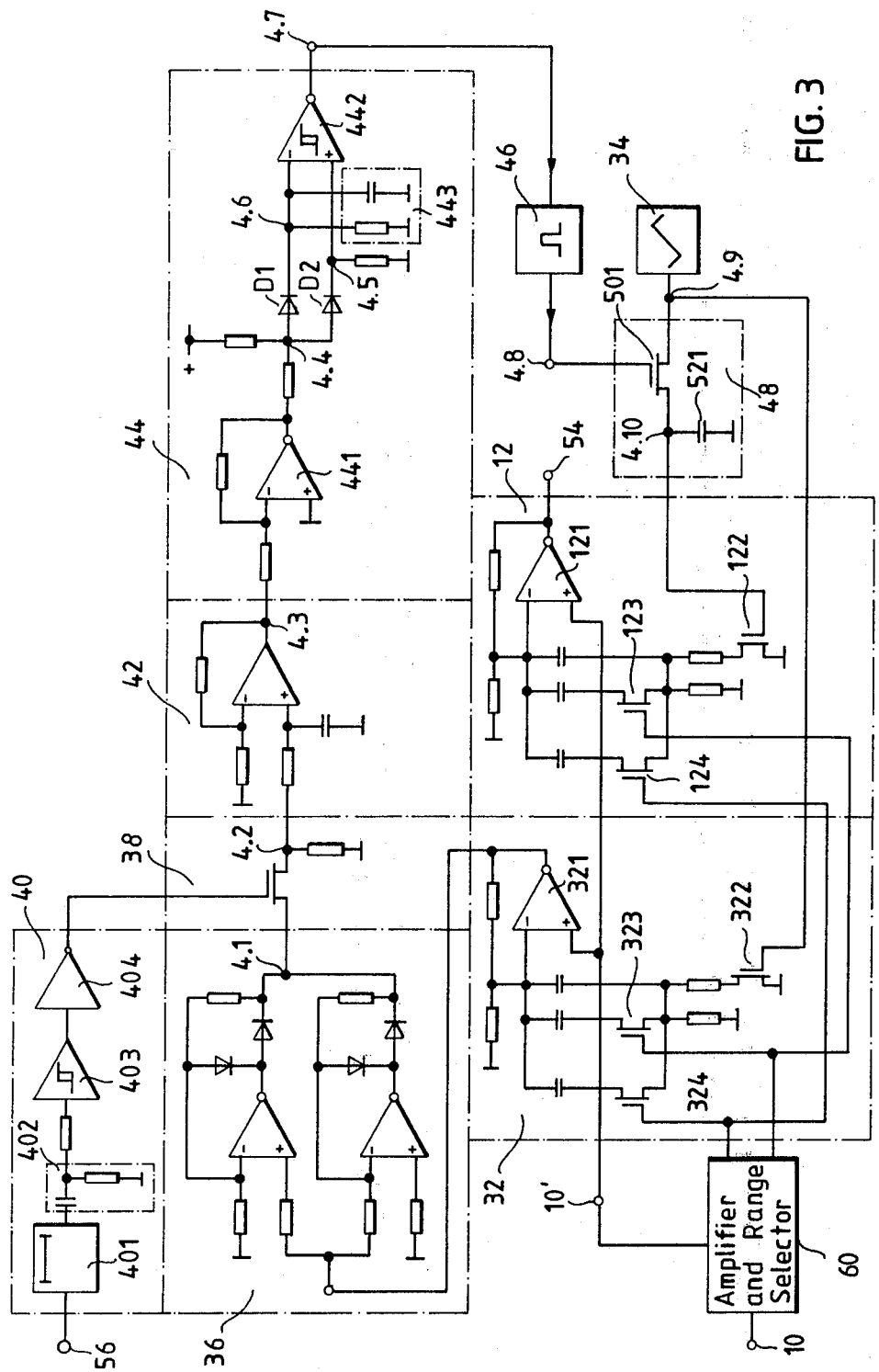
FIG. 3 shows a schematic circuit diagram of the arrangement according to FIG. 2.

FIG. 3 shows a possible circuit arrangement of FIG. 2.

The generation of the data window will next be discussed. The scanning circuit 40 contains a delay element 401 which receives the auxiliary timing pulses from the synchronizing unit 18 (as shown in FIG. 2) by way of a terminal 56 and delays these by an adjustable time $t_1$. If it is assumed that the edge of the auxiliary timing pulse is in phase with the mean zero-axis crossing of the input signal, then the delay time $t_1$ corresponds to the half-period duration of the input signal minus the half width x of the desired data window (see for example signal 4.1 in FIG. 4). This delay can be achieved digitally with the aid of a timing counter. In this way, when the transmission speed is switched over the delay can be matched in a simple way by switching over the clock frequency at the same time the delayed auxiliary timing pulse reaches the scanning unit 40 by way of an RC differentiator element 402 on a switch amplifier 403 showing hysteresis. At the output of the switch amplifier 403 appears a pulse corresponding in its position and width to the data window x, which pulse connects through with a field-effect transistor representing the gate circuit 38 by way of an inverter 404.

The equalizers 12 and 32 are represented in FIG. 3 as amplifiers 121 or 321 provided with a frequency-dependent wiring. The time constants of the frequency-dependent wiring are variable by means of field-effect transistors 122,123,124 or 322,323 and 324, the field-effect transistors 122 and 322 being acted on by the regulating value from the scanning and holding circuit 48 or by the regulating signal from the sweep unit 34. In place of the field-effect transistors 122 and 322, other regulating elements may be used. Thus the resistances connected at the input side of the above-mentioned field-effect transistors may for example be designed as photo resistors which are irradiated by light-emitting diodes. The light-emitting diodes (LED's) must be powered by the voltage which in the embodiment example represented in FIG. 3 is fed to the gates of the field-effect transistors 122 or 322. For their operation it is only important that both regulating elements 122 and 322 have exactly the same regulation characteristics. The other respective field-effect transistors serve for a coarse range switching, which in the embodiment represented is automatically done by an amplifier and range selector 60 depending on the input signal to the input terminal 10, but may also be done manually. The amplifier and range selector 60 also amplifies the input signal appearing on the input terminal 10 and feeds it to a terminal 10.

The embodiment of the full-wave rectifier 36 represented in FIG. 3 is understandable in itself to one skilled in the art and requires no further explanation. The same holds true for the integrator 42. The output voltage of the integrator 42 becomes minimal when the best setting of the auxiliary equalizer 32 is reached. A NOT element 441 connected at the output side of the integrator 42 in the extreme value detector 44 converts this minimum to a maximum. The output of the NOT element 441 is connected to the two inputs of a differential amplifier 442 subject to hysteresis, by way of a respective diode $D_1$, $D_2$.

Connected to the inverse input of the differential amplifier 442 there is also a delay network consisting of the parallel connection of a capacitor and a resistance. This delay network 443 causes each change in voltage of the output voltage of the NOT element 441 to become appreciably retarded at the inverting input of the differential amplifier 442, as compared with the noninverting output, by the amount of the time constant of the delay network 443. Thus a voltage reversal occurs at the output of the differential amplifier 442 as soon as the output voltage of the NOT element 441 exceeds a maximum. The voltage reversal at the output of the differential amplifier 442 is converted into a short-duration control pulse for the scanning and holding circuit 48 by means of the pulse former 46 which may involve a monostable sweep stage.

The time constant of the delay network 443 has a determining effect on the mode of operation of the circuit represented. Both in the application case described and in other application cases the case may occur that the criterion which indicates the correct setting of the auxiliary signal processing circuit frequently occurs within the regulating range of the auxiliary signal processing circuit. If this criterion relates to the maximum occurring at the output of the NOT element 441, then a number of maxima can therefore occur which differ in their absolute level. If the optimum setting is at the maximum having the highest absolute value, then by a suitable proportioning of the time constants of the delay network 443 it is achieved that the main signal processing circuit, or here the main equalizer 12 is set at this optimum. The time constant of the delay network 443 must, for this purpose, be large compared with the period duration of the regulating signal of the sweep unit 34, in such a way that the capacitor of the delay network 443 is so fully discharged during this period that in the next cycle the optimum maximum of the differential amplifier 442 can be detected anew, that other maxima with a lower absolute value are not detected, since for these the voltage on the noninverting input of the differential converter 442 always remains lower than that stored in the capacitor of the delay network 443. The time constant of the delay network 443 should not be chosen to be too high, however, since the conditions may change continuously and the absolute value of the highest maximum may become lower. In this case of course, not too long a time should elapse until, after the corresponding discharge of the capacitor in the delay network 443, a new voltage reversal occurs at the output of the differential amplifier 442, which triggers the pulse former 46. In order to avoid a more or less poor compromise for choosing the time constant of the delay network 443, a resetting circuit can be provided which quickly discharges the capacitor of the delay network 443 when the sweep unit 34 has emitted no control pulse from the pulse former 46 in a duration of one or two periods of the regulating signal.

The sweep unit 34 feeds a sawtooth or triangular voltage to the gate of the field-effect transistor 322 in the auxiliary equalizer 32. By way of a field-effect transistor 501 operating as a gate circuit 50, output of the sweep unit 34 is connected with a storage capacitor 521 for the duration of a control pulse from the impulse former 46. The gate of the field-effect transistor 122 is connected to the storage capacitor.

FIG. 4 shows the respective signals at different points on the circuit of FIG. 3 for the different setting positions 1 to 5. For sake of correlation of the signals represented under 4.1 to 4.10, the related circuit points are correspondingly designated as 4.1 to 4.10 in FIG. 3.

The signal 4.3 at the output of the integrator 42 increases to the degree that the equalization of the input signal becomes poorer. The signal 4.4 which is inverted with respect to this becomes worse. The signal 4.5 is essentially identical to the signal 4.4. However the signal 4.6 follows the signal 4.5 with a substantial delay. When the voltage value of the signal 4.6 becomes greater than that of the signal 4.5, after the ratio has first been reversed, a voltage occurs according to the signal 4.7 on the output of the differential amplifier 442. The broken-line edges in FIG. 4.7 denote the region within which the voltage jump can occur. This voltage jump triggers the pulse former circuit 46 which feeds the impulse signal 4.8 to the gate of the field-effect transistor 501. At the moment this pulse occurs, the storage capacitor 521 according to FIG. 4.10 accepts the momentary signal value of the regulating signal 4.9 from the sweep unit 34. The duration of the pulse 4.8 is chosen so that on one hand the storage capacitor 521 can be charged fully up to the regulating value and that on the other hand during this charging period only a negligible change in signal value of the regulating signal 4.9 occurs.

In the following, two embodiments of the phase synchronization device 22 will be described on the basis of FIGS. 5A and 5B.

It has already been stated at the outset that it is often advantageous to shift the phase position of the data gained from the distorted input signal after demodulation, in the synchronized state, by means of a local receiver timing pulse of the receiving point, instead of generating a processing timing pulse agreeing with the data phase. The local receiver timing pulse agrees relatively accurately in its frequency with the data timing pulse, but the respective phases are not correlated.

The device contains as its essential element a phase shifter or the delay unit 20 which receives the data for processing from the demodulator 16 at its terminal 19 and delivers these data to the output terminal 26 with a certain phase shift. The synchronizing unit 30, which is connected with the output of the delay unit 20 derives from the phase-shifted data the corresponding phase-shifted data timing pulse. It is simpler to determine the phase difference between this data timing pulse and the receiver timing pulse than directly between the receiver timing pulse and the data. The delay unit can be built by the principle of a circuit arrangement essentially known from German Application No. 24 10 957 and contain a digitally programmable monostable sweep stage consisting of an eight-bit counter in combination with a flip-flop. Since the phase difference between the receiver timing pulse and the data or the data timing pulse can be very variable and fluctuate between zero and a whole bit time, it is advantageous to choose the mean delay time as 1.5 times the bit time. Since the known circuit arrangement mentioned allows a delay of one bit time at most, two such circuit arrangements are to be connected in series in the present case. Basically this delay unit can be designed in a similar way. The digital design, however, has the advantage that it operates precisely and that in switching over to other data transmission speeds only the timing pulse frequency of the counter in the delay unit need be switched over accordingly. The counters in the delay unit are presettable counters, and the total delay time depends on this presetting. In place of such a circuit arrangement, a shift register could also be used as a delay unit.

The phase comparator circuit of the regulating unit 28 in the embodiment represented includes three D flip-flops 281, 282 and 283 as well as two inverters or NOT gates 284, 285 and a NAND element 286. The flip-flop 281 is fed by the synchronizing unit 30 with the data timing pulse and counts this by two to obtain a 2:1 scaling ratio. The wiring of the D flip-flop serving this purpose can be recognized in the representation and need not be explained. The receiving timing pulse from the terminal 24, by way of the NOT gate 284, reaches the timing input of the flip-flop 282 which makes a count-by-two scaling of the receiver timing pulse. One input of the NAND element 286 is connected with the output of the flip-flop 282, the other input of the NAND element 286 is connected with the terminal 24. The output of the NAND element 286 is connected, by way of the NOT gate 285, with the timing pulse input of the flip-flop 283, to the D input of which the output of the flip-flop 281 is connected. The action of this circuit is that the position of the flip-flop 283 is reversed each time when the sign of the phase difference between the data timing pulse from the synchronizing unit 30 and the receiver timing pulse on the terminal 24 changes, that is, when the phase lag on the receiver timing pulse with respect to the data timing pulse becomes a phase lead or vice versa.

The regulating unit 28 moreover includes a bidirectional counter 287, the input of which is acted on by a counting pulse $T_z$ the repetition frequency of which is large compared with that of the data timing pulse and receiver timing pulse. This counting pulse is continuously applied to the counter 287.

Figure 5A:
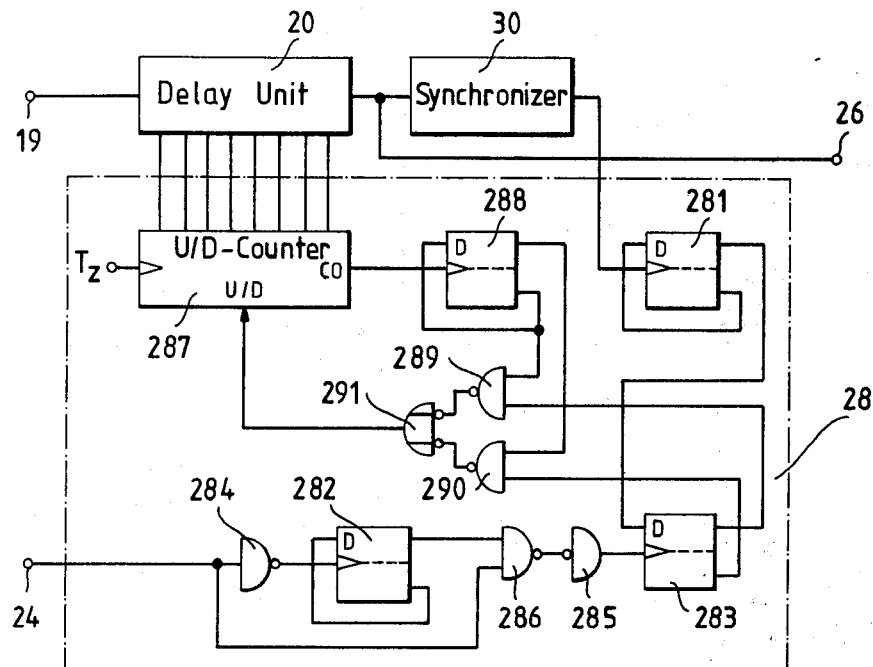
FIG. 5A shows a detailed block circuit diagram of a first embodiment of the phase synchronizing device.
Figure 5B:
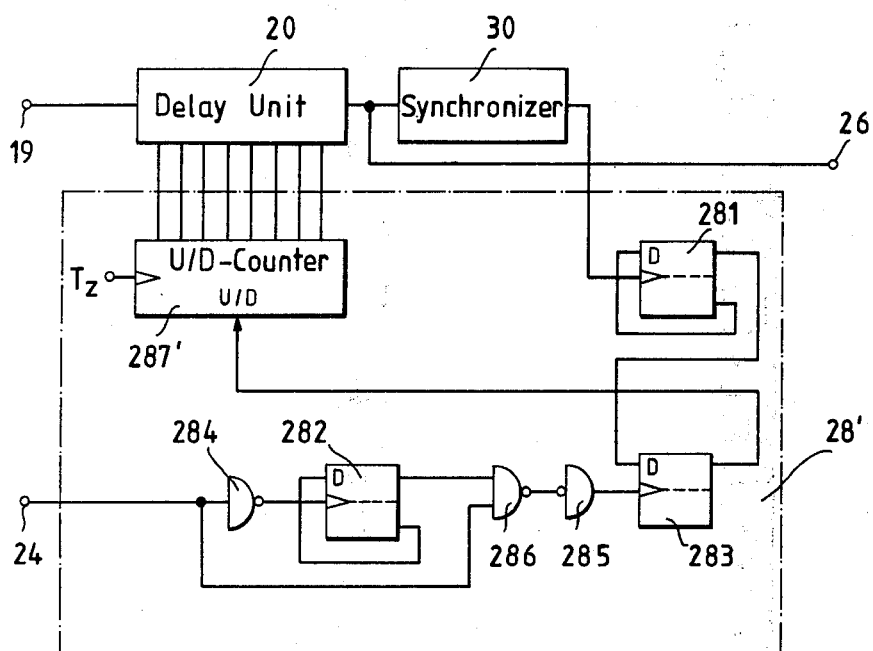
FIG. 5B shows a block circuit diagram of a second embodiment of the phase synchronization device.

The above description applies both to the regulating unit 28 according to FIG. 5A and also to the regulating unit 28' according to FIG. 5B. The regulating unit 28 of FIG. 5A has another D flip-flop 288 which respectively switches over the counting unit by way of NAND elements 289, 290 and 291, when the counter has gone all the way through or its counting position has become zero and an output pulse appears on the transmission terminal CO. The regulating unit 28' of FIG. 5B however is simplified by using a counter 287' which upon exceeding its capacity is automatically reset to zero. The mode of operation of both embodiments of the circuit is the same apart from this difference and will be explained below. It may be assumed that the phase difference between the data timing pulse and the receiver pulse is positive, which can signify that the phase of the data timing pulse leads that of the receiver timing pulse. For matching the phases, then, the phase shift must be increased by the delay unit. With this positive phase difference, the position of the flip-flop 283 causes the counter 286 (287') to count in the forward direction. Its counting position thus increases with each pulse of the counter timing pulse $T_z$. An increased counter position of the counter 287 (287') causes a correspondingly greater delay through the delay unit 20. The phase difference established by the phase comparator therefore decreases will at some time reach a value of zero and then become negative. This change in sign leads to a change in state of the flip-flop 283 and thereby to a change in the counting direction of the counter 287 (287'). In this way the delay is reduced further by means of the delay unit 20, until a change of sign of the phase difference occurs again. In this way the delay oscillates through the delay unit 20 by a value such that the phase difference between the data received and the receiver timing pulse has an average of zero.

In the whole system represented in FIG. 1, four control loops are operating, all of which have an influence on the phase, and the control criteria of which are phase-sensitive. The one closed loop controls the setting of the main equalizer 12. The synchronizing units 17 and 30 may contain a second and third control loop if they do not generate the data signal but have their own time bases which can be frequency controlled and phase-controlled with the aid of the data signal. The regulating unit and delay unit in the phase-synchronizing circuit 22, finally, form the fourth control loop. If the synchronizing units are digital in design, abrupt fluctuations in the data timing pulse corresponding to the resolution of the digital circuit still remain at the output, which cannot be controlled. Since the delay unit and the phase comparator are digital in design, a varying phase difference still remains here too, depending on the resolution of the circuit. Therefore in order to attain a stable control it is necessary that the different control loops operate with such widely different time constants that no hunting will occur. Moreover the time constants must be chosen so that the statistical effects of interferences on the phase are largely removed and a well-defined control results in the optimum. The time constant at which the counter 287 (287') oscillates around the optimum counter position is considerably larger than the regulating time of the synchronizing unit.

I claim:

1. A system for setting a signal processing circuit to an optimum response condition comprising:

means (10) for receiving a transmitted data signal;

a main signal processor (12) having an input connected to means (10) for receiving the transmitted signal and having a regulable response characteristic;

an auxiliary signal processor (32) having an input also connected to said means (10) for receiving the transmitted data signal and also having a regulable response characteristic equal to that of the main signal processor (42);

means (34) having a control output quantity connected to the auxiliary signal processor (32) for varying the regulable response characteristic thereof over a predetermined range which includes at least one optimum response condition;

means (36, 38, 42, 44, 46) connected to the auxiliary signal processor for detecting the optimum response condition in the output thereof and for generating a signal when said condition occurs;

holding means (50, 52) connected to for varying (34) and to said means for receiving (36, 38, 42, 44, 46) for receiving and holding the control output quantity of means (34) on occurrence of the signal from means (36, 38, 42, 44, 46); and said holding means (52) being connected to the main signal processor (32) to regulate the regulable response characteristic thereof to equal the response characteristic of the auxiliary signal processor (32) at which the optimum response condition occurred.

2. Apparatus as defined in claim 1 wherein the means (36, 38, 42, 44, 46) comprises a full wave rectifier (36) a time signal synchronized switch (38) an integrator (42) an extreme value detector (44) and a pulse generator (46).

3. Apparatus as defined in claim 1 wherein the main signal processor (12) and the auxiliary signal processor (32) are substantially identical equalizers.

* * * * *